(12) United States Patent
Kudo et al.

(10) Patent No.: US 12,361,781 B2
(45) Date of Patent: Jul. 15, 2025

(54) GAMING MACHINE OPERATION BUTTON, AND CONTROL DECK AND GAMING MACHINE COMPRISING SAME

(71) Applicant: OMRON CORPORATION, Kyoto (JP)

(72) Inventors: Takuya Kudo, Kyoto (JP); Masaaki Sumi, Kyoto (JP); Hiroyuki Onitsuka, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 117 days.

(21) Appl. No.: 18/056,787

(22) Filed: Nov. 18, 2022

(65) Prior Publication Data

US 2023/0186714 A1 Jun. 15, 2023

(30) Foreign Application Priority Data

Dec. 14, 2021 (JP) ................................. 2021-202279

(51) Int. Cl.
  *G07F 17/32* (2006.01)
  *H03K 17/96* (2006.01)
(52) U.S. Cl.
  CPC ...... *G07F 17/3209* (2013.01); *G07F 17/3211* (2013.01); *H03K 17/9631* (2013.01); *H03K 2017/9634* (2013.01)

(58) Field of Classification Search
  None
  See application file for complete search history.

(56) References Cited

U.S. PATENT DOCUMENTS

| 2005/0107167 | A1* | 5/2005 | Sasaki | G07F 17/3216 |
| | | | | 463/46 |
| 2005/0113174 | A1* | 5/2005 | Izawa | G07F 17/3216 |
| | | | | 463/46 |
| 2005/0119054 | A1* | 6/2005 | Izawa | G07F 17/32 |
| | | | | 463/46 |
| 2006/0079315 | A1* | 4/2006 | Okada | G07F 17/3246 |
| | | | | 463/25 |
| 2020/0090882 | A1 | 3/2020 | Sumi et al. | |
| 2024/0119808 | A1* | 4/2024 | Sumi | G07F 17/3213 |

FOREIGN PATENT DOCUMENTS

JP 2020-39813 A 3/2020

* cited by examiner

*Primary Examiner* — Ronald Laneau
(74) *Attorney, Agent, or Firm* — METROLEX IP LAW GROUP, PLLC; Robert L. Scott, Esq.

(57) ABSTRACT

An operation switch 30 is a gaming machine operation button that receives operation inputs to a gaming machine 1, and comprises a base plate 50, an operation button unit 36, and a touch switch 31. The operation button unit 36 is supported by the base plate 50, and is used by a player to input a first operation. The touch switch 31 is provided around the outer periphery of the operation button unit 36, and is used by the player to input a second operation that is different from the first operation.

11 Claims, 10 Drawing Sheets

GAMING MACHINE OPERATION BUTTON, AND CONTROL DECK AND GAMING MACHINE COMPRISING SAME

CROSS-REFERENCE TO RELATED APPLICATIONS

This application claims priority to Japanese Patent Application No. 2021-202279 filed on Dec. 14, 2021. The entire disclosure of Japanese Patent Application No. 2021-202279 is hereby incorporated herein by reference.

BACKGROUND

Technical Field

The present invention relates, for example, to a gaming machine operation button that is attached to a slot machine or other such gaming machine, and to an control deck and a gaming machine comprising this operation button.

Description of the Related Art

In recent years, casinos and other such gaming facilities have installed a plurality of gaming machines, such as a wide variety of slot machines. A player who has entered the gaming facility chooses the gaming machine he or she likes from among the plurality of installed gaming machines, and plays a game on that machine. It is therefore important for a gaming machine to be attractive enough to make players want to play that machine more than other models.

With these gaming machines, a player plays a game by directly operating the operation unit provided at the front of the gaming machine, facing the player. For this reason, the operation unit is an important part makes the machine attractive to the player.

For example, Patent Literature 1 discloses the configuration of a gaming machine comprising a push-button switch disposed on the right side (as viewed from the player) of an control deck installed on the front side of a gaming machine such as a slot machine, and a touch panel type of liquid crystal display device (LCD) disposed on the left side thereof.

CITATION LIST

Patent Literature

Patent Literature 1: JP-A 2020-39813

SUMMARY

Problem to be Solved by the Invention

However, the following problem is encountered with the above-mentioned conventional operation button for a gaming machine.

That is, with the gaming machine operation button disclosed in the above-mentioned publication, during a game a player has to move his or her arm back and forth between a push-button switch disposed on the right side (as viewed from the player) and a touch panel type of liquid crystal display device (LCD) disposed on the left side. Therefore, this could be an obstacle to improving the utilization rate of the gaming machine.

It is an object of the present invention to provide an operation button for a gaming machine, as well as an control deck and a gaming machine comprising this operation button, with which the utilization rate of a gaming machine can be improved.

Means for Solving Problem

The operation button for a gaming machine according to the first invention is a gaming machine operation button that receives operation inputs to a gaming machine, and comprises a base, a first operation unit, and a second operation unit. The first operation unit is supported on the base, and a player inputs a first operation thereto. The a second operation unit is provided around the outer periphery of the first operation unit, and the player inputs a second operation that is different from the first operation thereto.

Here, for example, in a gaming machine operation button provided to an control deck of a gaming machine such as a slot machine, different operations (a first operation and a second operation) are inputted to the first operation unit and the second operation unit provided around the outer periphery of the first operation unit.

Here, the first operation unit is, for example, a push-button switch disposed in the center portion of the gaming machine operation button, and is used for a first operation, such as starting the rotation of the reels of a slot machine or the like.

The second operation unit is, for example, one or more touch-type operation input units provided around the outer periphery of the first operation unit, and is used to input a bet operation (second operation), such as a bet button of a slot machine or the like.

Consequently, the first operation unit is disposed in the center of the gaming machine operation button, and is combined with the second operation unit that is disposed around the outer periphery thereof, so the first operation and the second operation can be consolidated into a single gaming machine operation button.

This means that the player can enjoy the playing with the minimum amount of movement, without having to play the gaming machine while moving his or her arm very far during the game.

As a result, the utilization rate of the gaming machine can be improved.

The gaming machine operation button according to the second invention is the gaming machine operation button according to the first invention, wherein the first operation unit is pressed by the player to perform the first operation.

Consequently, the gaming machine operation button can be configured such that a push-button first operation unit is at the center.

The gaming machine operation button according to the third invention is the gaming machine operation button according to the second invention, further comprising an elastic member that is provided between the first operation unit and the base, and that pushes the first operation unit back upward in response to a push-down operation by the player.

Consequently, when the push-button first operation unit is pressed by the player, it can be pushed back to its initial position by the elastic member (such as a spring), which makes the first operation unit easier to operate.

The gaming machine operation button according to the fourth invention is the gaming machine operation button according to any of the first to third inventions, wherein a plurality of the second operation units are provided around the outer periphery of the first operation unit.

Consequently, since a plurality of second operation parts are provided around the outer periphery of the first operation unit, the player can use the second operation unit, which has a plurality of functions, without having to move his or her arm, which makes possible a wider variety of operation inputs.

The gaming machine operation button according to the fifth invention is the gaming machine operation button according to any of the first to fourth inventions, wherein the second operation unit has a top plate, a pattern display layer that is provided to the lower layer of the top plate and displays a pattern indicating the position of the second operation unit, and a touch switch layer on which the second operation is performed when the player's finger touches the position of the second operation unit on the top plate.

Consequently, the touch-switch second operation unit that displays the position of the second operation unit by means of the pattern display device can be disposed around the outer periphery of the first operation unit.

The gaming machine operation button according to the sixth invention is the gaming machine operation button according to the fifth invention, further comprising a light source unit that is provided between the touch switch layer and the base, and emits light toward the pattern display layer through the touch switch layer.

Consequently, it is possible to switch between display and non-display of the second operation unit by selectively emitting light from the light source unit toward the pattern display device only when it is desired to display the second operation unit.

The gaming machine operation button according to the seventh invention is the gaming machine operation button according to the sixth invention, further comprising a blindfold layer that makes the pattern indicating the position of the second operation unit invisible from the surface side of the top plate in a state in which no light is being emitted from the light source unit.

Consequently, in a state in which no light is being emitted from the light source unit, the blindfold layer makes the second operation unit invisible, making it possible to clearly distinguish between display and non-display of the second operation unit.

The gaming machine operation button according to the eighth invention is the gaming machine operation button according to the seventh invention, wherein the blindfold layer has the property of transmitting light from the light source unit and reflecting light when viewed from the upper surface side of the top plate.

Consequently, the blindfold layer functions as a half mirror that transmits light from the light source unit side and reflects light from the upper surface side of the top plate, so in a state in which no light is being emitted from the light source unit, the pattern indicating the position of the second operation unit can be made invisible from the upper surface side of the top plate.

The gaming machine operation button according to the ninth invention is the gaming machine operation button according to the seventh or eighth invention, wherein the blindfold layer is provided between the top plate and the pattern display layer.

Consequently, since the blindfold layer is disposed on the upper surface of the pattern display layer that includes the pattern indicating the position of the second operation unit, the pattern indicating the second operation unit cannot be seen from the upper surface side of the top plate unless light is emitted from the light source unit.

The gaming machine operation button according to the tenth invention is the gaming machine operation button according to any of the sixth to ninth inventions, wherein a plurality of the second operation units are provided, and the operation button further comprises a light separation wall that is provided to the lower portion of the pattern indicating the position of the second operation unit, and separates the light emitted toward the second operation unit from the light emitted toward an adjacent second operation unit.

Consequently, the light emitted from the patterns indicating the positions of adjacent second operation units can be prevented from mixing, and the patterns indicating the positions of the second operation parts can be clearly displayed.

The control deck according to the eleventh invention comprises the operation button for a gaming machine according to any of the first to th e tenth inventions, and a non-contact power supply unit that is provided at a position away from the gaming machine operation button, is provided directly below a specific charging position, and performs non-contact charging of a device placed in the charging position.

Consequently, an control deck can have a simple configuration in which a gaming machine operation button and a charging position are provided on the control deck.

The control deck according to the twelfth invention is the control deck according to the eleventh invention, further comprising a game start detection unit that detects that play on the gaming machine has started.

Consequently, by detecting the start of the game, such as when the gaming machine receives a deposit or when there is an operation input to start play on the gaming machine, the light source unit can be made to emit light after the game starts, and the lighting of the light source unit can be controlled so that a pattern indicating the position of the second operation unit is displayed on the control deck.

The control deck according to the thirteenth invention is the control deck according to the twelfth invention, wherein the second operation unit has a top plate and a pattern display layer that is provided to the lower portion of the top plate and displays a pattern indicating the position of the second operation unit. The gaming machine operation button further comprises a light source unit that emits light toward the pattern display layer, and a control unit that controls the light source unit to emit the light when the game start detection unit detects the start of play on the gaming machine.

Consequently, after the start of play has been detected, such as when the gaming machine receives a deposit or when there is an operation input to start play on the gaming machine, the light source unit can be made to emit light, and a pattern indicating the position of the second operation unit can be displayed on the control deck, so that the position of the second operation unit is indicated on the control deck only during play of the game.

The gaming machine according to the fourteenth invention comprises the control deck according to any of the eleventh to the thirteenth inventions, a main body unit to which the control deck is attached, and a display monitor that is provided on the front side of the main body unit and displays game content.

Consequently, in a gaming machine comprising the above-mentioned control deck, the functions of the operation units (first operation unit and second operation unit) for performing a plurality of operation inputs to a gaming machine operation button installed on the control deck are consolidated, so the player can enjoy playing the game with a minimum of movement, without having to move his or her arm a long distance while playing the game.

As a result, the utilization rate of the gaming machine can be improved.

Effects

With the gaming machine operation button of the present invention, the utilization rate of a gaming machine can be improved.

DETAILED DESCRIPTION OF THE EMBODIMENT

An control deck 10 including the operation switch (gaming machine operation button) 30 according to an embodiment of the present invention, as well as a gaming machine 1 equipped with this operation switch, will now be described with reference to FIGS. 1 to 10.

In this embodiment, some unnecessarily detailed description may be omitted. For example, detailed description of already known facts or redundant description of components that are substantially the same may be omitted. This is to avoid unnecessary repetition in the following description, and facilitate an understanding on the part of a person skilled in the art.

The applicant has provided the appended drawings and the following description so that a person skilled in the art might fully understand this disclosure, but does not intend for these to limit what is discussed in the patent claims.

(1) Configuration of Gaming Machine 1

Figure 1:
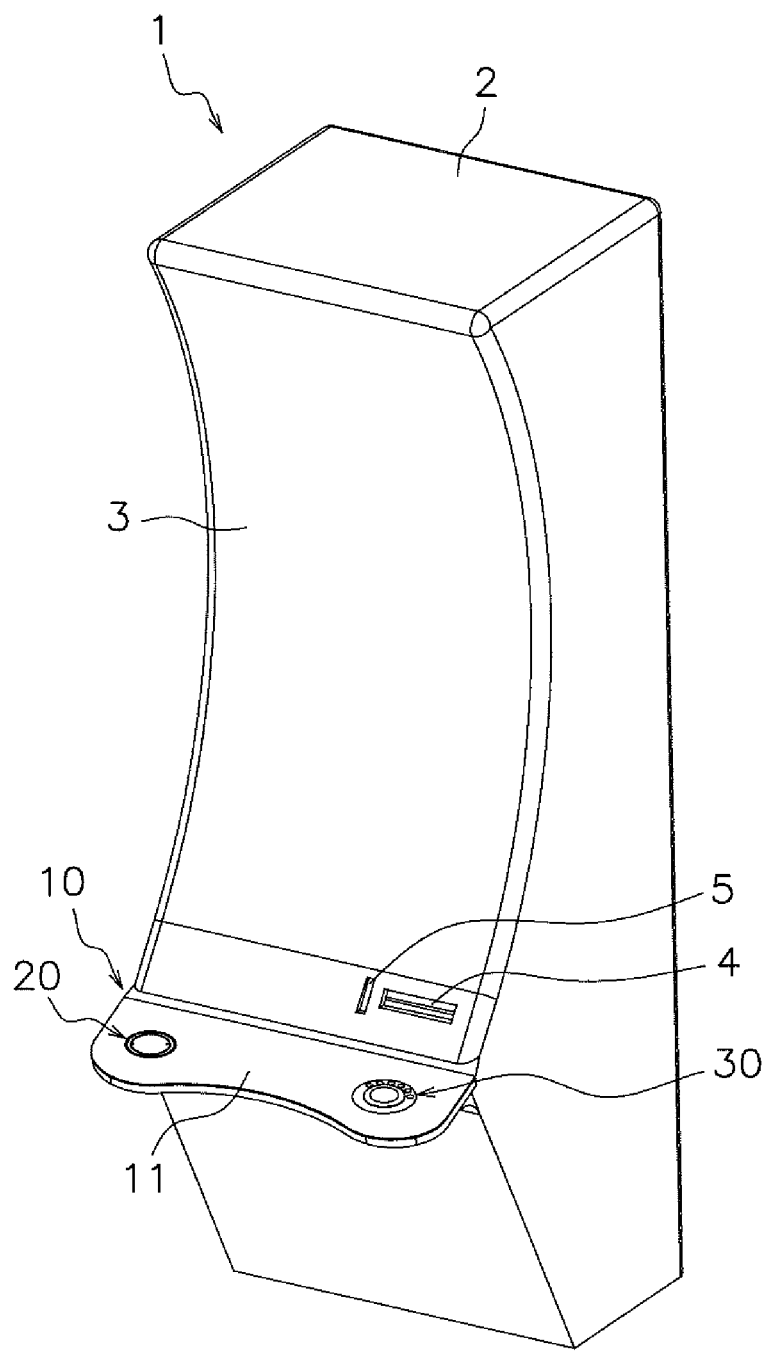
FIG. 1 is an overall oblique view of the configuration of a gaming machine equipped with an control deck including the operation switch according to an embodiment of the present invention.

The gaming machine 1 according to this embodiment is, for example, a slot machine as shown in FIG. 1, comprising a housing unit 2, a display monitor 3, a deposit unit 4, a card reception unit 5, and an control deck 10.

The housing unit 2 constitutes the outer shell of the gaming machine 1 and has a vertically oriented substantially cuboid shape. The display monitor 3 is provided to the housing unit 2 at a position corresponding to the eye level of the player, on the front side facing a player who is playing the game on the gaming machine 1. Also, the housing unit 2 is provided with the control deck 10 on which the player performs operation inputs, at a position below the display monitor 3, on the front side facing the player.

The display monitor 3 displays, for example, a plurality of reels that are rotated and stopped by player operations, and a winning combination is determined by the symbols displayed on the reels when the reels are stopped by the player's operation. As a result, the gaming machine 1 awards a prize according to the winning combination determined by the symbols shown on the stopped reels.

The display of the reels may be performed by displaying an image corresponding to the reels on a liquid crystal display screen or the like, or actual reels provided as rotating bodies may be disposed on the display monitor 3.

The deposit unit 4 is a deposit processing unit into which banknotes, tickets, receipts, or the like are inserted when a game is to be started on the gaming machine 1 (a slot machine, etc.). As shown in FIG. 1, the deposit unit 4 is provided above the right side of the control deck 10 in the housing unit 2 of the gaming machine 1.

The deposit unit 4 may have a banknote identification function for verifying whether a banknote is genuine or counterfeit when the banknote is inserted.

The card reception unit 5 is a card slot into which a membership card issued by a casino or other such gaming facility is inserted. The membership card is inserted by a registered member upon starting to play the gaming machine 1. As shown in FIG. 1, the card reception unit 5 is provided above the right side of the control deck 10 in the housing unit 2 of the gaming machine 1, and to the left of the deposit unit 4.

The control deck 10 is provided on the upper surface of a portion provided so as to protrude toward the player from the lower portion of the housing unit 2. As shown in FIG. 1, the control deck 10 is provided with a charging unit 20 and an operation switch 30. A top plate 11 is provided to the upper surface of the control deck 10.

(2) Configuration of Control Deck 10

Figure 2:
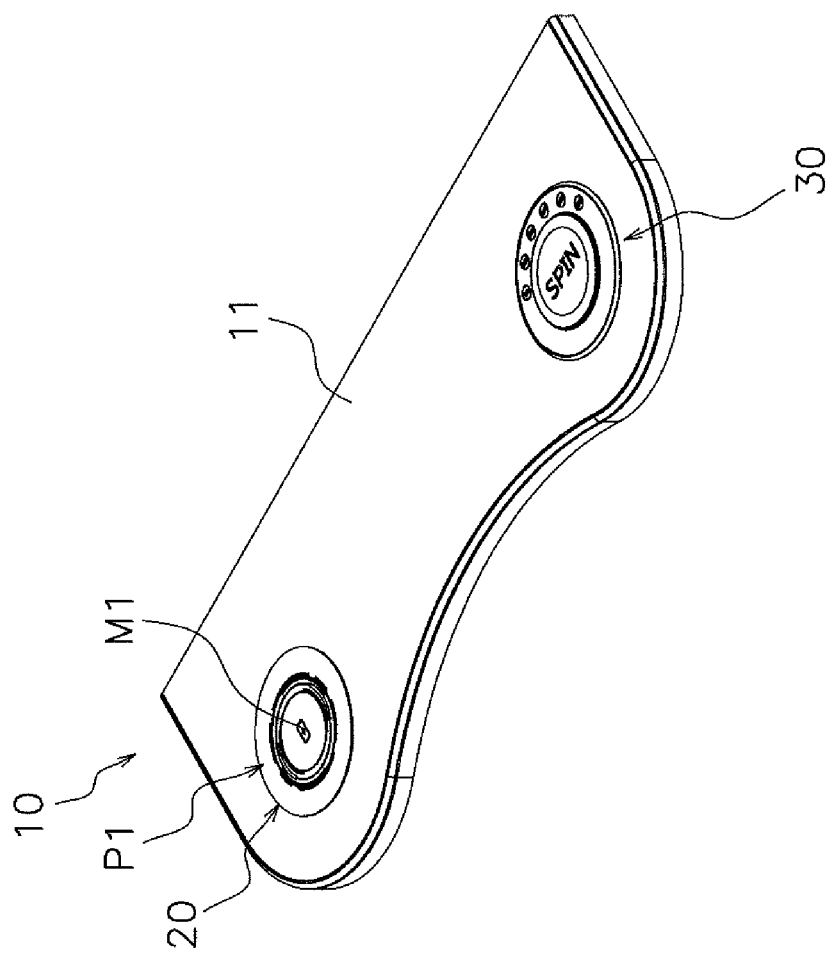
FIG. 2 is an oblique view of the configuration of the control deck installed at the front of the gaming machine in FIG. 1.

As shown in FIG. 2, the control deck 10 has an upper surface on which the player's hands, a device to be charged, and the like are placed. This upper surface is covered with a transparent top plate 11. Also, the charging unit 20 is disposed on the left side of the upper surface of the control deck 10, and the operation switch 30 is disposed on the right side.

The charging unit 20 includes a non-contact power supply unit 26 (see FIG. 3) that supplies power in a non-contact manner to a device placed at a specific charging position P1 (see FIG. 2, etc.) on the upper surface of the top plate 11.

Here, the device to be charged by the charging unit 20 is, for example, a smart phone, some other kind of mobile phone, a tablet terminal, a music player, or another such mobile device.

The operation switch 30 is used by the player while playing the gaming machine 1. The operation switch 30 is configured by combining a central operation button unit 36 and a plurality of touch switches 31 disposed around the outer periphery thereof (see FIG. 5).

Figure 3:
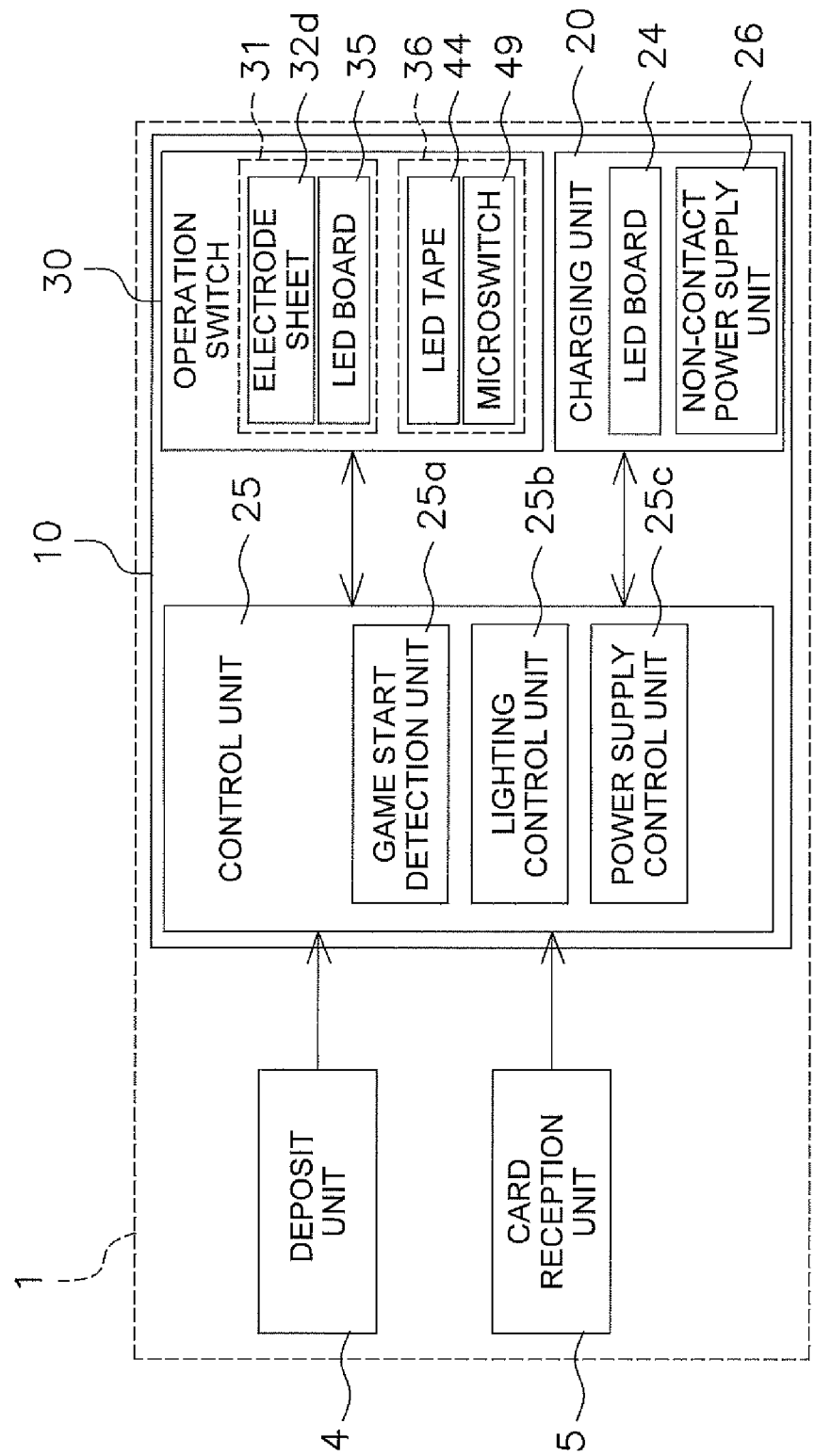
FIG. 3 is a control block diagram focusing on the control deck in FIG. 2.

As shown in FIG. 3, the control deck 10 comprises the deposit unit 4 and the card reception unit 5 on the gaming machine 1 side, an LED (light emitting diode) board 24 and the non-contact power supply unit 26 included in the charging unit 20, and a control unit 25 that is connected to an LED board 35, an LED board 44 (which has an adhesive layer on its back surface), etc., included in the operation switch 30 and that performs lighting control of the LED board 35, etc. (discussed below).

The control unit 25 acquires from a microswitch 49 a signal that has been inputted to the operation button unit 36 included in the operation switch 30, and acquires from the electrode sheet 32d the signals that have been inputted to the touch switches 31, and thereby controls the gaming machine 1 according to the operations inputted by the player.

Also, as shown in FIG. 3, the control unit 25 has a game start detection unit 25a, a lighting control unit 25b, and a power supply control unit 25c.

The game start detection unit 25a detects that a game of the gaming machine 1 has been started by detecting the insertion of banknotes or the like into the deposit unit 4. The game start detection unit 25a may also detect that the game of the gaming machine 1 has been started by detecting the insertion of a membership card into the card reception unit 5 of the gaming machine 1.

The lighting control unit 25b controls the LED board 35 to light the LEDs 35a when the game start detection unit 25a has detected the start of play on the gaming machine 1. Consequently, a pattern indicating a bet buttons 32ca included in the decorative plate 32 (discussed below) becomes visible from the upper surface side of the top plate 11.

The lighting control unit 25b controls the LED board 35 so as to switch off the LEDs 35a when it is assumed that play on the gaming machine 1 has ended after any banknotes, receipts, etc., of the remaining money have been refunded from the deposit unit 4, for example. Consequently, the patterns indicating the bet buttons 32ca and the help button 32cb included in the decorative plate 32 (discussed below) can be made invisible when play on the gaming machine 1 comes to an end.

The power supply control unit 25c controls the non-contact power supply unit 26 so as to supply power to the device placed on the specific charging position P1 in a state in which play on the gaming machine 1 has started.

Figure 4:
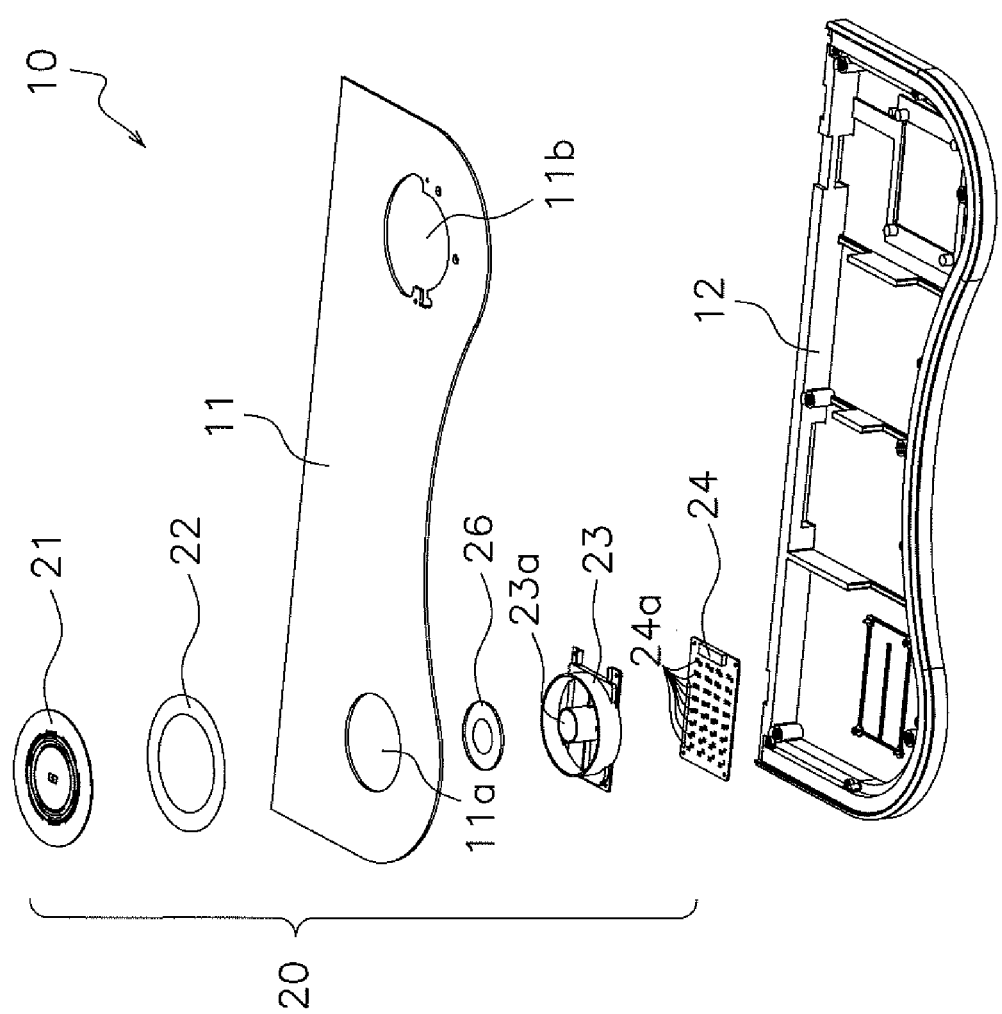
FIG. 4 is an exploded oblique view of the configuration of the charging unit side of the control deck in FIG. 2.

The top plate 11 is, for example, a flat member made of stainless steel or the like, and as shown in FIG. 4, forms the upper surface of the control deck 10 and has an opening 11a formed to line up with the position where the charging unit 20 is installed, and an opening 11b formed to line up with the position where the operation switch 30 is installed.

As shown in FIG. 4, a base portion 12 is a housing that constitutes the lower surface side of the control deck 10, and houses the various components that make up the charging unit 20 and the operation switch 30.

(3) Detailed Configuration of Charging Unit 20

Figure 7:
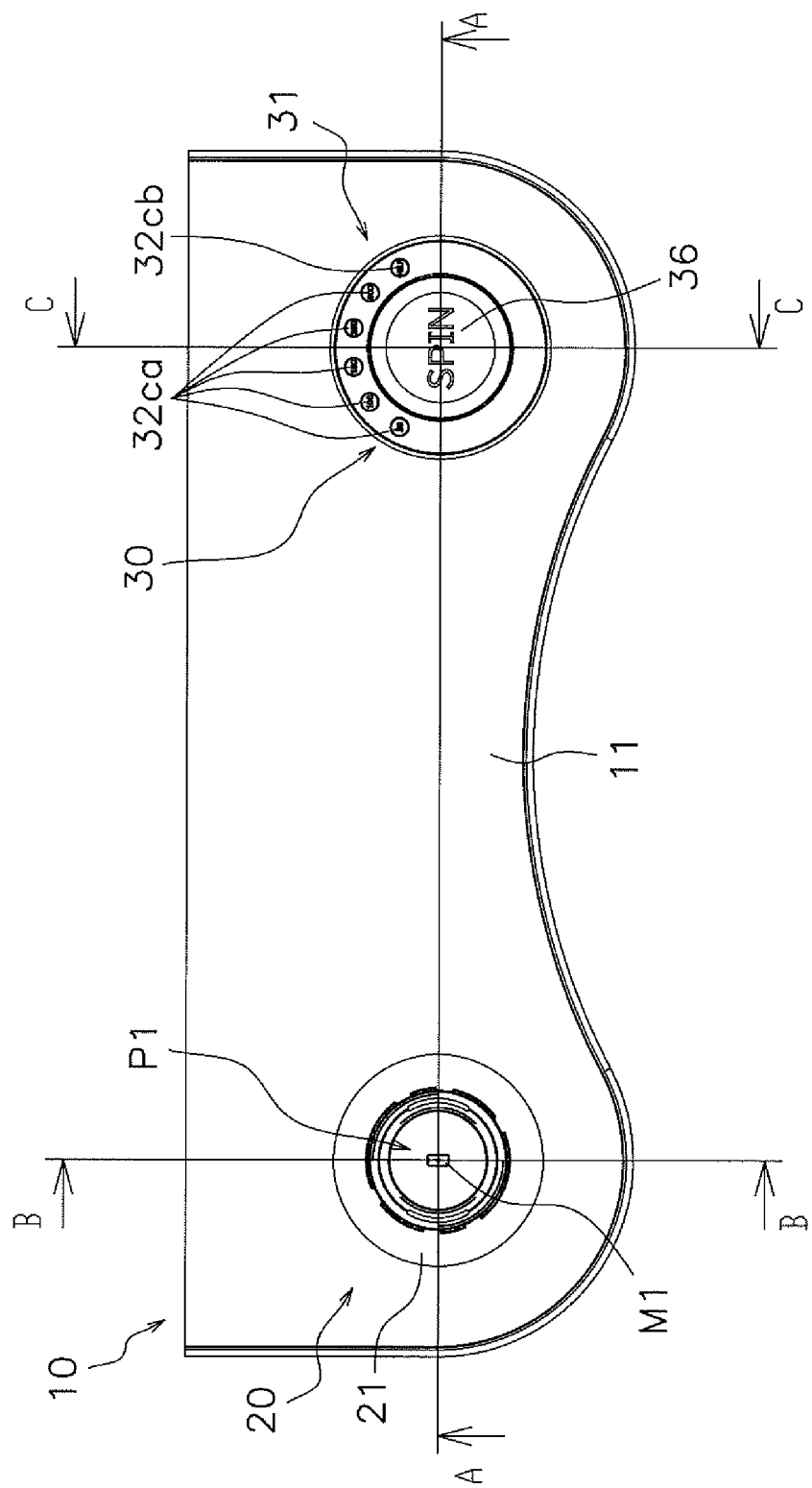
FIG. 7 is a top view of the control deck in FIG. 2.

The charging unit 20 is disposed on the left side of the upper surface of the control deck 10, as shown in FIG. 7, etc.

The charging unit 20 has a decorative plate 21, double-sided tape 22, a board cover 23, an LED board 24, and a non-contact power supply unit 26, as shown in FIG. 4.

As shown in FIG. 4, the decorative plate 21 is a substantially disk-shaped sheet including a pattern indicating the charging position P1, and is affixed to the upper surface of the top plate 11.

Consequently, when light is emitted from the LED board 24, the pattern indicating the charging position P1 becomes visible from the upper surface side of the top plate 11.

As shown in FIG. 2, etc., the pattern indicating the charging position P1 includes a plurality of circles and a charging mark M1 disposed in the center of the circles. This pattern is made visible when the above-mentioned lighting control unit 25b of the control unit 25 lights the LEDs 24a, and becomes invisible when the LEDs 24a are switched off.

As shown in FIG. 4, the double-sided tape 22 is a substantially annular adhesive sheet provided for affixing the decorative plate 21 to the upper surface of the top plate 11, and is configured to include an adhesive substance on both the upper surface side and the lower surface side. The double-sided tape 22 has an inside diameter larger than the inside diameter of the opening 11a formed in the upper surface of the top plate 11, and is affixed around the outer periphery of the opening 11a.

Figure 8:
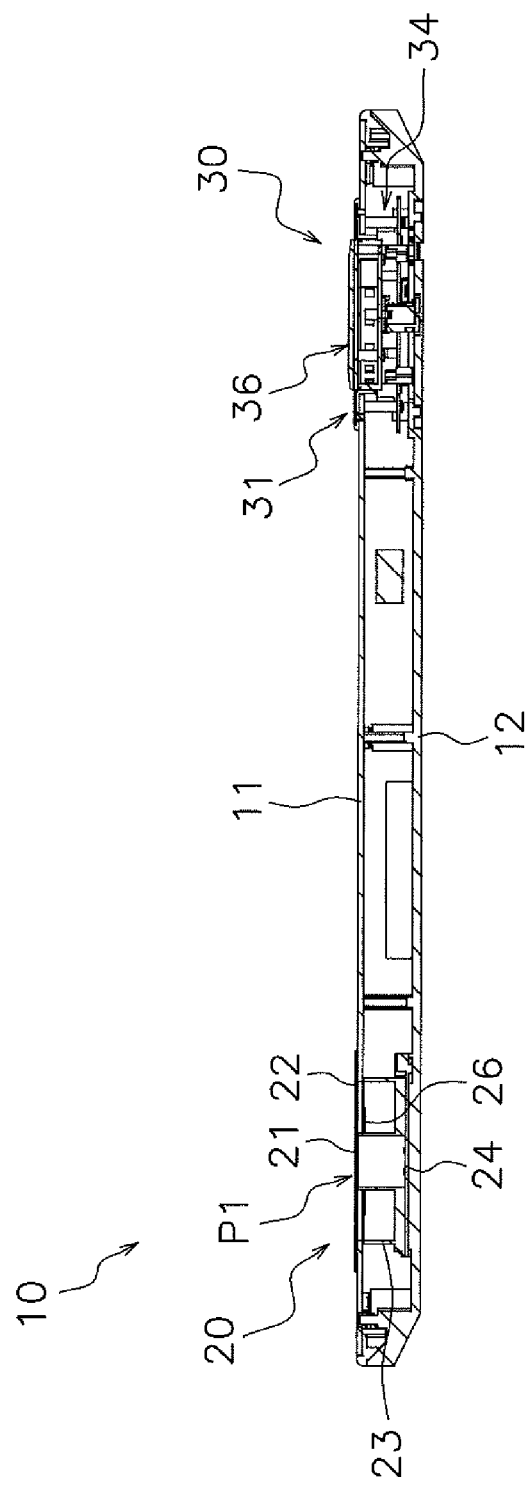
FIG. 8 is a cross-sectional view along the A-A line in FIG. 7.

As shown in FIGS. 4 and 8, the board cover 23 is a substantially cylindrical member that is disposed in the gap between the top plate 11 and the base portion 12 along with the LED board 24, the non-contact power supply unit 26, etc., and has a partition 23a.

As shown in FIG. 4, the partition 23a is a cylindrical portion on the inside of the board cover 23 including cylindrical portions that are concentrically disposed. The partition 23a is disposed so as to cover the upper space of the LEDs 24a that emit light toward the central charging mark M1 (see FIG. 2) of the pattern indicating the charging position P1. Therefore, the cylindrical upper space of the LEDs 24b that emit light toward the plurality of circular portions around the outer periphery of the charging mark M1 is shielded from the upper space of the LEDs 24a that emit light toward the charging mark M1.

The LED board 24 is attached to the upper surface of the base portion 12, and the LEDs 24a are disposed on the upper surface thereof. The LED board 24 is controlled by the control unit 25 so as to switch on and off the light emitted from the LEDs 24a, switch the color of the light, and so on.

The LEDs 24a are disposed in a lattice pattern at substantially regular intervals on the upper surface of the LED board 24, and emit light upward toward the decorative plate 21.

The non-contact power supply unit 26 is a bundle of annular coils provided as a power supply antenna, and as shown in FIGS. 4 and 8, is disposed directly under the decorative plate 21 including the charging mark M1 indicating the specific charging position. The non-contact power supply unit 26 performs non-contact power supply to the device placed on the charging mark M1.

(4) Detailed Configuration of Operation Switch 30

The operation switch 30 receives, for example, a first operation for performing a game, such as spinning the reels, in the gaming machine 1 (such as a slot machine), and a second operation for determining the bet to place on one play. The operation switch 30 is disposed on the right side of the upper surface of the control deck 10, as shown in FIG. 7, etc.

Figure 5:
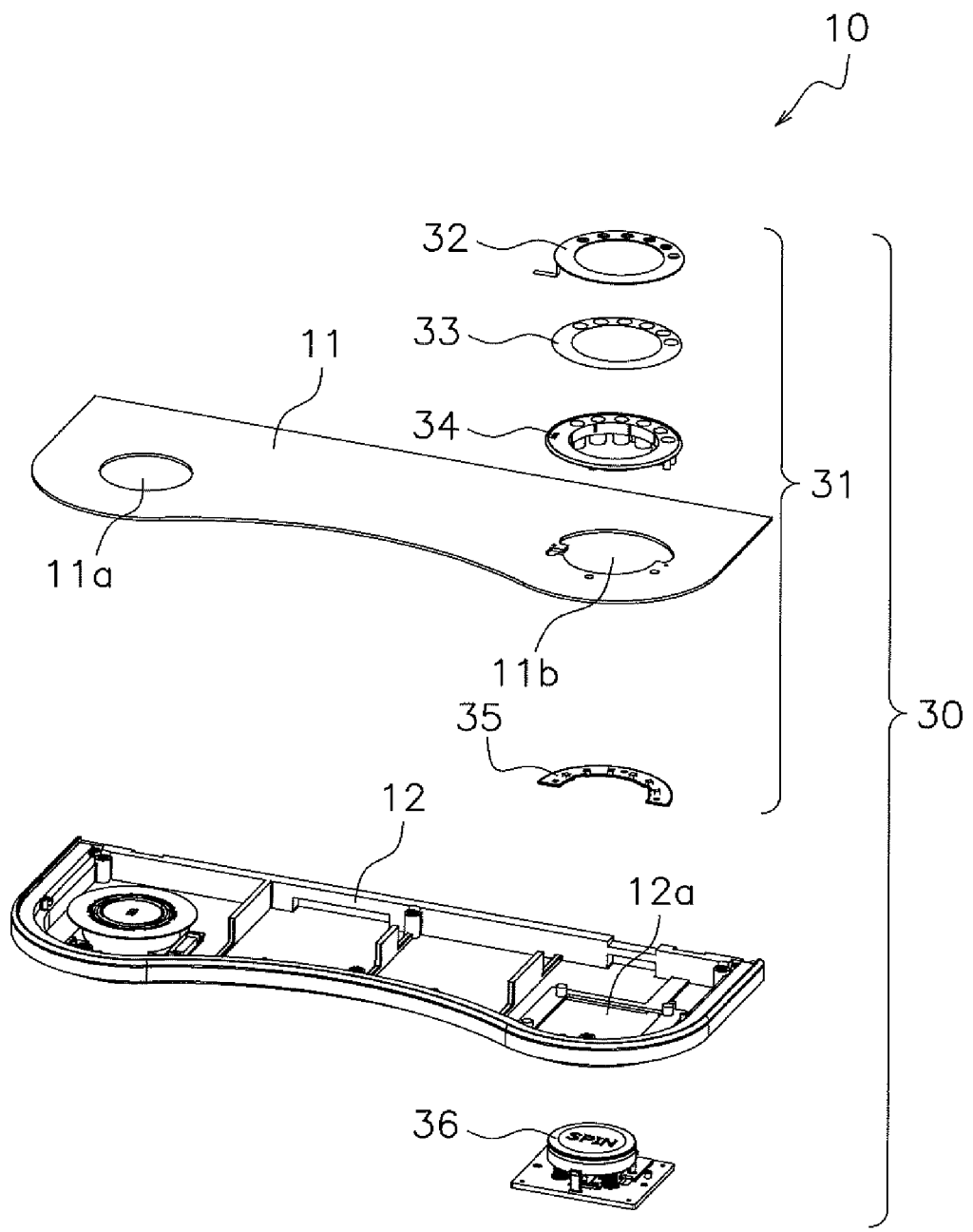
FIG. 5 is an exploded oblique view of the configuration of the operation switch side of the control deck in FIG. 2.

The operation switch 30 is a substantially cylindrical switch with which operations are inputted by a player operating the gaming machine 1, and as shown in FIG. 5, is made up of a combination of an operation button unit (first operation unit) 36 constituting the central portion of the operation switch 30, and touch switches (second operation units) 31 provided around the outer periphery thereof.

The touch switches 31 are capacitive touch sensors with which an operation (second operation) different from the operation (first operation) inputted to the operation button unit 36 is inputted by the player's finger while playing the gaming machine 1. In this embodiment, the touch switches 31 are assigned five bet buttons 32ca and one help button 32cb (see FIG. 10). The touch switches 31 each have a decorative plate 32, double-sided tape 33, a partition member 34, and an LED board 35, as shown in FIG. 5.

As shown in FIG. 5, the decorative plate 32 is a substantially disc-shaped sheet that includes a pattern indicating the bet buttons 32ca and the help button 32cb (see FIG. 10), and is affixed to the upper surface of the partition member 34.

Figure 9:
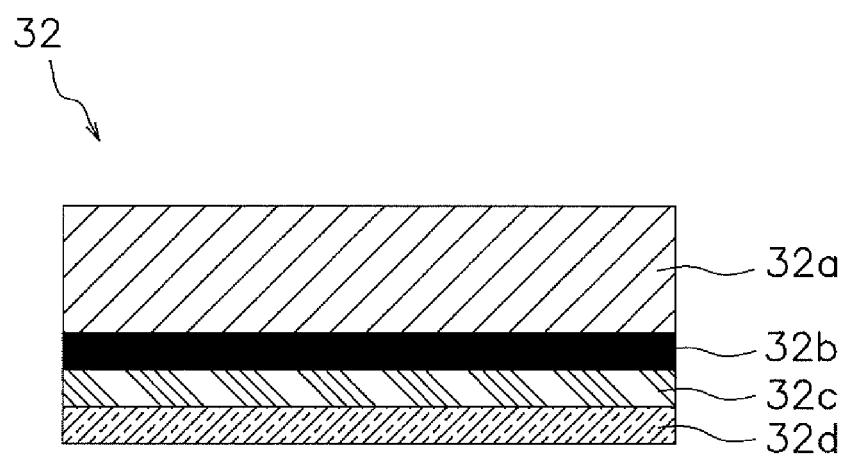
FIG. 9 is a cross-sectional view showing the configuration of a decorative plate included in the operation button of the control deck in FIG. 7.

Also, as shown in FIG. 9, the decorative plate 32 includes an acrylic plate (top plate) 32a, a black mirror sheet (blindfold layer) 32b, a design sheet 32c, and a touch switch electrode sheet 32d.

The acrylic plate 32a is, for example, a substantially transparent disc-shaped member made of PMMA (polymethyl methacrylate) resin, and forms the touch surface of the touch switches 31. The acrylic plate 32a is disposed on the uppermost surface side of the decorative plate 32, as shown in FIG. 9.

As shown in FIG. 9, the black mirror sheet (blindfold layer) 32b is disposed between the acrylic plate 32a (the surface layer) and the design sheet 32c. The black mirror sheet 32b is visible as an entirely black surface when viewed from the upper surface side of the top plate 11 in a state in which no light is being emitted from the LED board 35, and is provided so that the pattern indicating the bet buttons 32ca and the like will be invisible. Also, the black mirror sheet 32b has a property of transmitting light from the LED board 35 side and reflecting light from the upper surface side of the top plate 11.

Consequently, unless light is emitted from the LED board 35, the pattern indicating the bet buttons 32ca and the help button 32cb cannot be seen from the upper surface side of the top plate 11.

Figure 10:
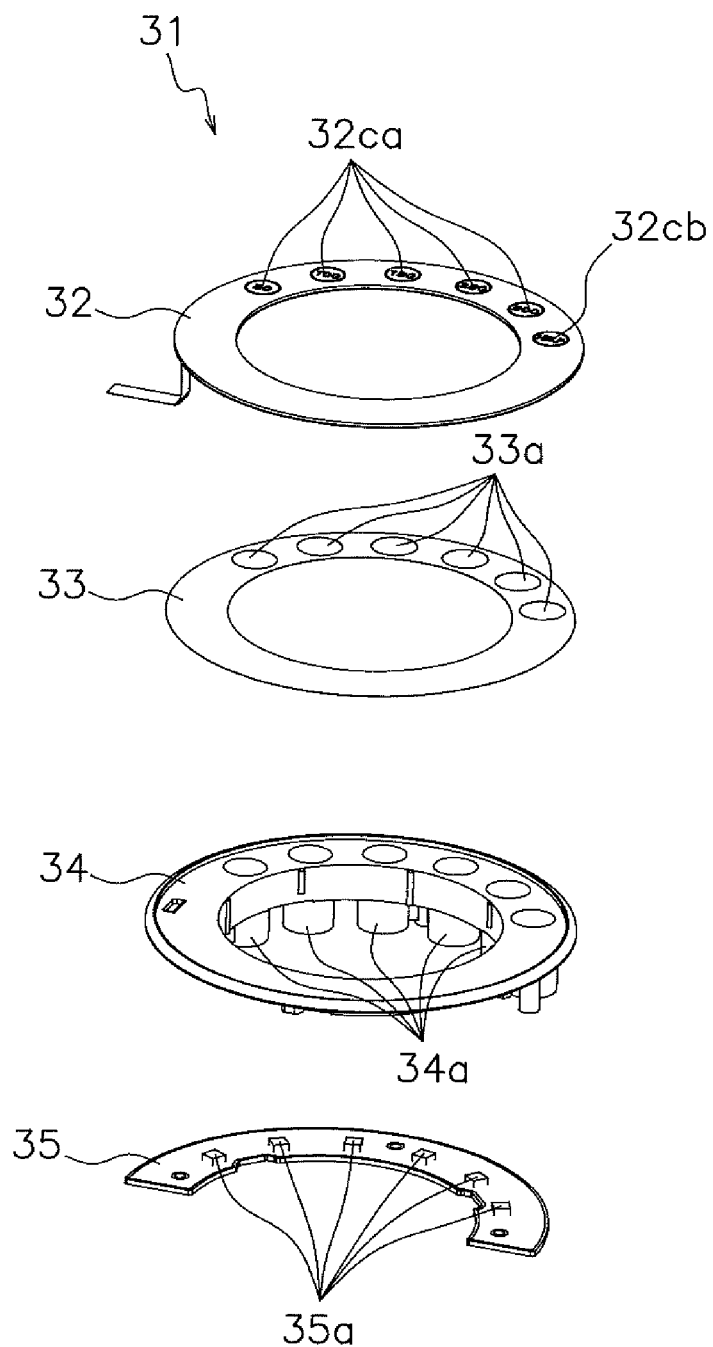
FIG. 10 is an exploded oblique view of the configuration of a touch switch included in the operation switch in FIG. 6.

As shown in FIG. 9, the design sheet (pattern display layer) 32c is provided between the black mirror sheet 32b and the touch switch electrode sheet 32d included in the decorative plate 32, and includes a pattern indicating the bet buttons 32ca and the help button 32cb (see FIG. 10).

The pattern indicating the bet buttons 32ca and the help button 32cb has bet amounts (50, 100, 150, 250, and 500) or the word "HELP" written in independent circles, as shown in FIG. 10, etc. This pattern becomes visible when the lighting control unit 25b of the control unit 25 lights the LEDs 35a once play starts on the gaming machine 1, and becomes invisible when the LEDs 35a are switched of once play on the gaming machine 1 comes to an end.

As shown in FIG. 9, the touch switch electrode sheet 32d is disposed on the bottom layer of the decorative plate 32, and is a capacitive sensor that detects when the finger of the player touches the position of a touch switch 31 on the acrylic plate 32a.

As shown in FIG. 5, the double-sided tape 33 is a substantially annular adhesive sheet provided for affixing the decorative plate 21 to the upper surface of the partition member 34, and is configured to include an adhesive substance on both the upper surface side and the lower surface side. The double-sided tape 33 has an inside diameter larger than the inside diameter of the opening 11a formed in the upper surface of the top plate 11, and is affixed to the partition member 34 around the outer periphery of the opening 11a. Also, the double-sided tape 33 has a plurality of openings 33a formed at positions corresponding to the bet buttons 32ca and the help button 32cb included in the decorative plate 32, as shown in FIG. 10.

Consequently, the light emitted from the LEDs 35a (discussed below) is emitted toward the decorative plate 32 without being blocked by the double-sided tape 33.

As shown in FIGS. 5, 8, etc., the partition member 34 is a substantially annular member provided between the upper surface of the top plate 11 and the double-sided tape 33. The partition member 34 has a plurality of cylindrical partitions 34a projecting from the lower surface of the substantially annular portion toward the upper surface of the LED board 35.

As shown in FIG. 10, the plurality of cylindrical partitions 34a are installed so that their respective cylindrical portions cover the individual LEDs 35a of the LED board 35.

As a result, the partitions 34a allow the beams of light emitted from the individual LEDs 35a of the LED board 35 to be emitted toward the decorative plate 32 provided above, without being mixed with each other. Therefore, the bet buttons 32ca and the help button 32cb included in the decorative plate 32 can be displayed more clearly.

The LED board 35 is controlled by the control unit 25, and has six LEDs 35a disposed on a semicircular board, as shown in FIG. 10.

As shown in FIG. 10, the plurality of LEDs 35a are disposed at approximately equal intervals along the semicircular LED board 35, at positions corresponding to the plurality of partitions 34a, the bet buttons 32ca, and the help button 32cb, and emit light upward in the drawing.

Figure 6:
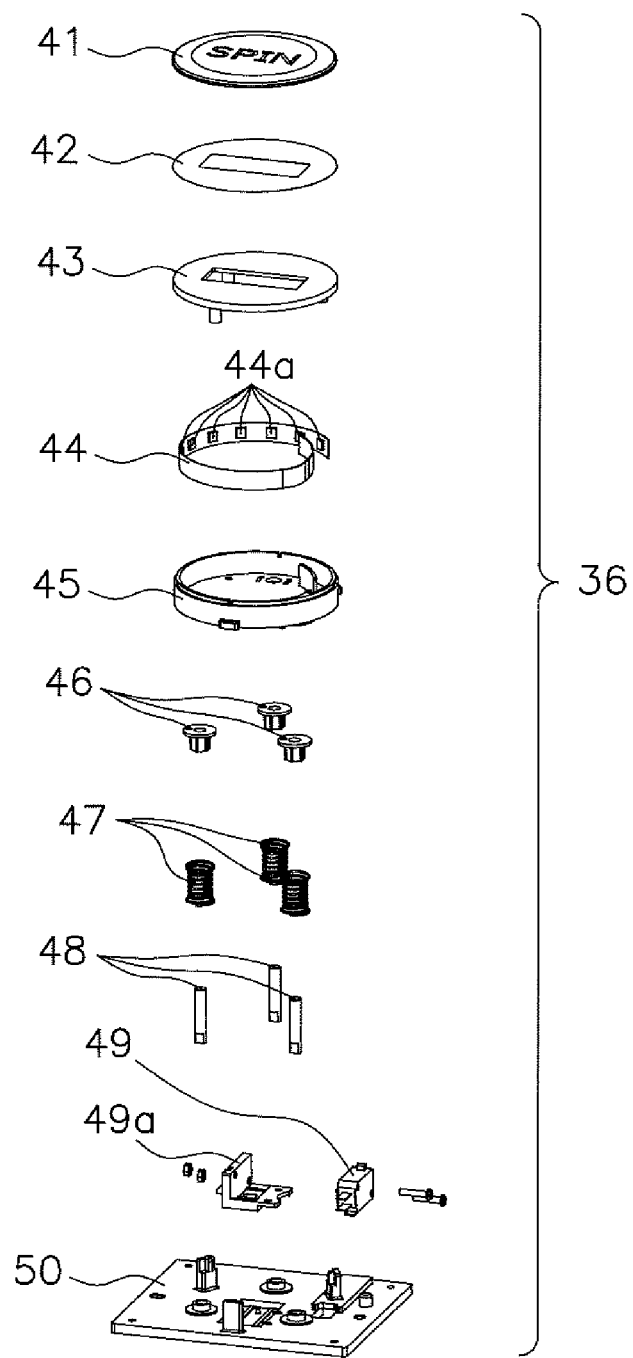
FIG. 6 is an exploded oblique view of the configuration of an operation button included in the operation switch.

The operation button unit 36 is a push-button switch that constitutes the central portion of the operation switch 30, and as shown in FIG. 5, the operation button unit 36 is attached in a state of being inserted from below into the opening 12a in the base portion 12. As shown in FIG. 6, the operation button unit 36 has a decorative plate 41, double-sided tape 42, a cover member 43, an LED board 44 (which has an adhesive layer on its back surface), a base component 45, spacers 46, springs (elastic members) 47, shafts 48, a microswitch 49, and base plate 50.

As shown in FIG. 6, the decorative plate 41 is a substantially disc-shaped member that forms the top surface of the operation button unit 36, and includes a design sheet on which word "SPIN" is written. The word "SPIN" on the decorative plate 41 is visible from the upper surface side of the top plate 11 upon the lighting of the LEDs 44a of the LED board 44 (discussed below).

As shown in FIG. 6, the double-sided tape 42 is a substantially annular adhesive sheet for affixing the decorative plate 41 to the upper surface of the cover member 43, and is provided between the decorative plate 41 and the cover member 43.

As shown in FIG. 6, the cover member 43 is a substantially annular member and is attached to the base component 45.

The LED board 44 is a tape-shaped member that includes an adhesive layer on its back surface and has a plurality of LEDs 44a disposed around the inner peripheral surface as shown in FIG. 6. The plurality of LEDs 44a emit light radially inward from the inner peripheral surface of the substantially cylindrical base component 45.

As shown in FIG. 6, the base component 45 is a substantially cylindrical member and holds the LED board 44 on its inner peripheral surface side. Also, the base component 45 is provided in a state of being able to move to a position close to the base plate 50 when the operation button unit 36 is pressed down.

As shown in FIG. 6, the spacers 46 are attached to the upper ends of the three shafts 48, respectively, and are provided in order to absorb the XY positional crossing of the three axes.

As shown in FIG. 6, the springs (elastic members) 47 are held in a state in which the three shafts 48 have been inserted on the inner peripheral side. The springs 47 impart an elastic force that pushes the base component 45 back upward when the operation button unit 36 is operated in the downward direction.

As a result, if the operation button unit 36 is pushed down by the player, the base component 45, including the decorative plate 41 of the operation button unit 36 and the LED board 44, etc., will be returned to its initial position by the elastic force of the springs 47.

The upper ends of the shafts 48 are fixed to the base component 45, and the lower ends to the base plate 50, as shown in FIG. 6. When the operation button unit 36 is pushed down, the base component 45 moves downward along the three shafts 48 and is returned to its initial position by the elastic force of the springs 47.

The microswitch 49 is a switch for detecting the pressing of the operation button unit 36 and a switch signal, and is provided on the upper surface of the base plate 50 via an attachment part 49a, as shown in FIG. 6.

As shown in FIG. 6, the base plate 50 is a flat member constituting the bottom portion of the operation button unit 36, and supports on its upper surface the three shafts 48, the microswitch 49, and so forth. When the operation button unit 36 is pushed down, the base component 45 holding the decorative plate 41, the cover member 43, the LED board 44, and the like moves up and down with respect to the base plate 50.

Main Features

The operation switch 30 in this embodiment is a gaming machine operation button that receives operation inputs for the gaming machine 1 shown in FIG. 1, and comprises the base plate 50, the operation button unit 36, and the touch switches 31, as shown in FIGS. 5 and 6. The operation button unit 36 is supported by the base plate 50, and a first operation is inputted thereto by the player. The touch switches 31 are provided around the outer periphery of the operation button unit 36, and the player inputs thereto a second operation that is different from the first operation.

Consequently, since the operation switch 30 is configured by a combination of the operation button unit 36 disposed in the center and the touch switches 31 disposed around the periphery thereof, different operations (first operation and second operation) can be performed can be consolidated into a single operation switch 30.

Consequently, the player of the gaming machine 1 can enjoy the game with a minimum number of motions, without having to move his or her arm very far during the game, so the utilization rate of the gaming machine 1 can be improved.

In particular, with the operation switch 30 of this embodiment, the SPIN button (operation button unit 36) for rotating the reels of the gaming machine 1 (such as a slot machine) and the bet buttons (touch switches 31) are disposed at positions close to each other, and therefore all the buttons operated by the player during the game are consolidated.

As a result, the player has to move his or her arm over a shorter range during the game, and the game can thus be played faster, which means that the utilization rate of the gaming machine 1 can be improved.

In addition, since the player of the gaming machine 1 does not need to move his or her arm very far each time the gaming machine 1 is played, the spilling of a drink or the like placed on the control deck 10 during the game can be avoided.

Other Embodiments

An embodiment of the present invention was described above, but the present invention is not limited to or by the above embodiment, and various modifications are possible without departing from the gist of the invention.

(A)

In the above embodiment, an example was given in which the control unit 25 (the game start detector 25a, the lighting control unit 25b, and the power supply control unit 25c) provided in the control deck 10 controlled the lighting of the LED board 35 only during a game, but the present invention is not limited to this.

For example, the control unit that performs lighting control may be used along with a control unit provided inside the gaming machine. That is, control on the control deck side may be performed by the control unit on the gaming machine side.

(B)

In the above embodiment, an example was given in which the push-button operation button unit 36 was applied as the first operation unit and the touch switch 31 was applied as the second operation unit. However, the present invention is not limited to this.

For example, the first operation unit and the second operation unit are not limited to the combination of a push-button operation unit and a touch-switch operation unit as described above, and the first operation unit and the second operation unit may both be a push-button operation unit, or both may be a touch-switch operation unit.

Also, the first operation unit and the second operation unit are not limited to the push-button or touch-switch operation units described above, and may instead be operation units that employ some other method, such as a cross key.

(C)

In the above embodiment, an example was given in which, when play on the gaming machine 1 was started, the lighting control unit 25b of the control unit 25 controlled the LED board 35 on the touch switch 31 side of the operation switch 30 so that the LEDs 35a would be switched on and the pattern of the bet buttons 32ca, etc., became visible. However, the present invention is not limited to this.

For example, the configuration may be such that the LED board on the touch switch side of the operation switch is controlled so that the LEDs are lit and the pattern of the buttons, etc., becomes visible regardless of whether or not the gaming machine is being played.

(D)

In the above-described embodiment, an example was given in which the decorative plate 32 included in the touch switch 31 as the second operation unit included the black mirror sheet (blindfold layer) 32b having a half mirror function, as shown in FIG. 9. However, the present invention is not limited to this.

For example, the operation switch may be configured to comprise a decorative plate that does not include a black mirror sheet (blindfold layer).

In this case, compared to a configuration that includes a black mirror sheet, the pattern indicating the positions of the bet buttons, etc., will not be completely invisible, but the pattern indicating the charging position will still be difficult to see when the light source is turned off, so the same effect as described above can be obtained.

(E)

In the above embodiment, an example was given in which, when the game start detection unit 25a of the control unit 25 detected deposit processing from the deposit unit 4, or when the card reception unit 5 detected the insertion of a membership card or the like, it was determined that a game had been started, and the lighting control unit 25b switched on the LEDs 35a of the LED board 35. However, the present invention is not limited to this.

For example, the game start detection unit may determine that a game has been started on the gaming machine by detecting the operation of an operation switch, rather than deposit processing or the reception of a membership card.

(F)

In the above embodiment, an example was given in which the decorative plate 32 included in the touch switch 31 as the second operation unit included the black mirror sheet (blindfold layer) 32b and the design sheet (design display layer) 32c, as shown in FIG. 9. However, the present invention is not limited to this.

For example, the decorative plate included in the operation button unit as the first operation unit may comprise components corresponding to the blindfold layer and the pattern display layer, just as on the second operation unit side.

(G)

In the above embodiment, as shown in FIG. 4, an example was given in which the charging unit 20 and the operation switch 30 were respectively installed in the openings 11a and 11b formed in the top plate 11. However, the present invention is not limited to this.

For example, a specific charging position and an operation switch may be installed at specific positions of the top plate without any openings.

(H)

In the above embodiment, as shown in FIG. 1, an example was given in which the control deck 10 was provided so as to protrude from the front of the gaming machine 1 toward the player. However, the present invention is not limited to this.

For example, the shape and size of the control deck are not limited to the mode shown in FIG. 1, and other modes may be employed instead.

(I)

In the above embodiment, an example was given in which the top plate 11 was made of stainless steel. However, the present invention is not limited to this.

For example, the top plate may be a flat member made of glass that transmits light. However, in the case of a top plate in which an opening is provided at the charging position and the charging unit is disposed so as to be fitted into the opening as in Embodiment 1, a flat member may instead be formed of a metal or the like that does not transmit light.

(J)

In the above embodiment, an example was given in which the slot machine shown in FIG. 1 was used as the gaming machine to which the control deck of the present invention was attached. However, the present invention is not limited to this.

For example, the gaming machine to which the control deck of the present invention is attached may be a pachinko game, a card gaming machine for playing poker or the like, a mahjong machine, or the like, instead of a slot machine.

INDUSTRIAL APPLICABILITY

The operation button for a gaming machine of the present invention exhibits the effect of improving the utilization rate of a gaming machine, and as such can be widely applied to various kinds of gaming machine, such as slot machines.

REFERENCE SIGNS LIST 1 gaming machine
2 housing unit
3 display monitor
4 deposit unit
5 card reception unit
10 control deck
11 top plate
11a, 11b opening
12 base portion
20 charging unit
21 decorative plate
22 double-sided tape
23 board cover
23a partition (light separation wall)
24 LED board (light source)
24a LED
25 control unit
25a game start detection unit
25b lighting control unit
25c power supply control unit
26 non-contact power supply unit
30 operation switch (operation button for a gaming machine)
31 touch switch (second operation unit)
32 decorative plate
32a acrylic plate (top plate)
32b black mirror sheet (blindfold layer)
32c design sheet (pattern display layer)
32ca bet button
32cb help button
32d touch switch electrode sheet
33 double-sided tape
33a opening
34 partition member
34a partition (light separation wall)
35 LED board (light source unit)
35a LED
36 operation button unit (first operation unit)
41 decorative plate
42 double-sided tape
43 cover member
44 LED board
44a LED
45 base component
46 spacer
47 spring (elastic member)
48 shaft
49 microswitch
49a attachment part
50 base plate
M1 charging mark
P1 charging position

The invention claimed is:

1. An operation button for a gaming machine, which receives operation inputs to the gaming machine, the operation button comprising:
a base;
a first operation unit that is supported on the base and to which a player inputs a first operation;
a second operation unit that is provided around an outer periphery of the first operation unit and to which the player inputs a second operation that is different from the first operation; and
an elastic member that is provided between the first operation unit and the base, and configured to push the first operation unit back upward in response to a push-down operation by the player,
wherein the first operation unit is pressed by the player to perform the first operation.

2. The operation button for a gaming machine according to claim 1,
wherein a plurality of the second operation units are provided around the outer periphery of the first operation unit.

3. An operation button for a gaming machine, which receives operation inputs to the gaming machine, the operation button comprising:
a base;
a first operation unit that is supported on the base and to which a player inputs a first operation; and
a second operation unit that is provided around an outer periphery of the first operation unit and to which the player inputs a second operation that is different from the first operation,
wherein the second operation unit has a top plate, a pattern display layer that is provided to the lower layer of the top plate and displays a pattern indicating a position of the second operation unit, and a touch switch layer on which the second operation is performed when the player's finger touches the position of the second operation unit on the top plate.

4. The operation button for a gaming machine according to claim 3,
further comprising a light source unit that is provided between the touch switch layer and the base, and configured to emit light toward the pattern display layer through the touch switch layer.

5. The operation button for a gaming machine according to claim 4,
further comprising a blindfold layer configured to make the pattern indicating the position of the second operation unit invisible from a surface side of the top plate in a state in which no light is being emitted from the light source unit.

6. The operation button for a gaming machine according to claim 5,
wherein the blindfold layer has a property of transmitting light from the light source unit and reflecting light when viewed from an upper surface side of the top plate.

7. The operation button for a gaming machine according to claim 5,
wherein the blindfold layer is provided between the top plate and the pattern display layer.

8. The operation button for a gaming machine according to claim 4,
wherein a plurality of the second operation units are provided, and
the operation button further comprises a light separation wall that is provided to the lower portion of the pattern indicating the position of the second operation unit, and configured to separate the light emitted toward the second operation unit from the light emitted toward an adjacent second operation unit.

9. An operation button for a gaming machine, which receives operation inputs to the gaming machine, the operation button comprising:
a base;
a first operation unit that is supported on the base and to which a player inputs a first operation;
a second operation unit that is provided around an outer periphery of the first operation unit and to which the player inputs a second operation that is different from the first operation, and
a game start detection unit configured to detect that play on the gaming machine has started,
wherein the second operation unit has a top plate and a pattern display layer that is provided to the lower portion of the top plate and displays a pattern indicating the position of the second operation unit, and
the operation button for a gaming machine further comprises:
a light source unit that emits light toward the pattern display layer; and
a control unit that controls the light source unit to emit the light when the game start detection unit detects a start of play on the gaming machine.

10. An control deck, comprising:
the operation button for a gaming machine according to claim 9; and
a non-contact power supply unit that is provided at a position away from the operation button for a gaming machine, is provided directly below a specific charging position, and configured to perform non-contact charging of a device placed in the charging position.

11. A gaming machine, comprising:
the control deck according to claim 10;
a main body unit to which the control deck is attached; and
a display monitor that is provided on a front side of the main body unit and displays game content.

* * * * *